(12) United States Patent
Pan

(10) Patent No.: US 7,388,708 B2
(45) Date of Patent: Jun. 17, 2008

(54) SPATIAL LIGHT MODULATOR MULTI-LAYER MIRROR PLATE

(75) Inventor: Shaoher X. Pan, San Jose, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 0 days.

(21) Appl. No.: 11/470,568

(22) Filed: Sep. 6, 2006

(65) Prior Publication Data

US 2007/0053052 A1 Mar. 8, 2007

Related U.S. Application Data

(60) Provisional application No. 60/714,568, filed on Sep. 6, 2005.

(51) Int. Cl.
G02B 26/00 (2006.01)
G02B 7/182 (2006.01)
G02B 26/08 (2006.01)

(52) U.S. Cl. .................. 359/291; 359/295; 359/872; 359/224

(58) Field of Classification Search ............. 359/224, 359/290, 291, 292, 295, 872
See application file for complete search history.

(56) References Cited

U.S. PATENT DOCUMENTS

| | | | |
|---|---|---|---|
| 5,661,591 A | 8/1997 | Lin et al. | |
| 6,469,821 B2 | 10/2002 | Bartlett et al. | |
| 6,487,001 B2 | 11/2002 | Greywall | |
| 6,819,469 B1 * | 11/2004 | Koba | 359/290 |
| 6,819,470 B2 | 11/2004 | Meier et al. | |
| 6,870,659 B2 | 3/2005 | Aubuchon | |
| 6,914,711 B2 | 7/2005 | Novotny et al. | |
| 6,992,810 B2 | 1/2006 | Pan et al. | |
| 7,068,417 B2 * | 6/2006 | Yang | 359/291 |
| 7,148,603 B1 | 12/2006 | Garcia et al. | |
| 7,167,298 B2 | 1/2007 | Pan | |
| 7,245,415 B2 | 7/2007 | Pan | |
| 2004/0240033 A1 | 12/2004 | Pan et al. | |
| 2005/0128564 A1 | 6/2005 | Pan | |
| 2007/0018261 A1 | 1/2007 | Doan | |
| 2007/0122292 A1 * | 5/2007 | Etter et al. | 417/234 |
| 2007/0127110 A1 * | 6/2007 | Pan | 359/298 |
| 2007/0134896 A1 * | 6/2007 | Lee et al. | 438/551 |
| 2008/0013147 A1 * | 1/2008 | Pan | 359/226 |

* cited by examiner

*Primary Examiner*—David N Spector
(74) *Attorney, Agent, or Firm*—Fish & Richardson P.C.

(57) ABSTRACT

A spatial light modulator having a multi-layer mirror is described.

20 Claims, 11 Drawing Sheets

SPATIAL LIGHT MODULATOR MULTI-LAYER MIRROR PLATE

CROSS-REFERENCE TO RELATED APPLICATIONS

This application claims the benefit of U.S. Provisional Application No. 60/714,568, filed on Sep. 6, 2005, which is incorporated by reference herein.

BACKGROUND

The present specification relates to spatial light modulators (SLMs) and their operations.

Over the past fifteen to twenty years, micro-mirror based SLMs have made incremental technical progress and have gained acceptance in the display industry. The SLM devices operate by tilting individual micro-mirror plates around a torsion hinge with an electrostatic torque to deflect incident light in a direction that depends on the orientation of the micro-mirror plates. In digital mode operation, each individual micro-mirror plate acts as a pixel that can be turned "on" or "off" by selectively rotating the individual mirror. The mirrors are mechanically stopped at a specific landing position to ensure the precision of deflection angles. A functional micro-mirror array requires sufficient electrostatic torque to overcome contact sticking forces at the mechanical stops and efficient electrostatic torques to control timing and ensure reliability. A high performance SLM device for display applications may produce high brightness and high contrast ratio video images.

Early SLMs in video applications suffer a disadvantage of low brightness and low contrast ratio of projected images. Conventional SLM designs typically have a low active reflection area fill-ratio of pixels (e.g., ratio between active reflective areas and non-active areas in each pixel). A large inactive area around each pixel in the array of SLMs results in low optical coupling efficiency and low brightness. Scattered light from these inactive areas in the array forms diffraction patterns that adversely impact the contrast of video images. Another factor reducing the contrast ratio of micro-mirror array based SLMs is the diffraction of the scattered light from two straight edges of each mirror in the array that are perpendicular to the incident illumination. In a traditional square shape mirror design, orthogonal incident light is scattered directly by the perpendicular straight leading and trailing edges of each mirror in the array during the operation. The scattered light produces a diffraction pattern and the projection lenses collect much of the diffracted light. The bright diffraction pattern can smear out the high contrast of projected video images.

One type of micro-mirror based SLM device is the Digital Mirror Device (DMD), developed by Texas Instruments. Implementations include a micro-mirror plate suspended by a rigid vertical support post on top of a yoke plate. The yoke plate comprises a pair of torsion hinges and two pairs of horizontal landing tips above addressing electrodes. Electrostatic forces on the yoke plate and mirror plate are controlled by the voltage potentials on the addressing electrodes which cause the bi-directional rotation of both plates. The double plate structure is used to provide an approximately flat mirror surface that covers the underlying circuitry and hinge mechanism, which is one way to achieve an acceptable contrast ratio.

However, the vertical mirror support post that elevates the mirror plate above the hinge yoke plate potentially has negative influences on the contrast ratio of the DMD. A large dimple (caused by the fabrication of the mirror support post) is present at the center of the mirror in some designs. The dimple scatters reflected light and reduces optical efficiency. Double plate structures also tend to scatter incident light, which reduces the contrast ratio. Double plate rotation causes a horizontal displacement of the mirror surface along the surface of the DMD, resulting in a horizontal vibration of a micro-mirror during operation. Additionally, the horizontal movement of the mirrors during rotation requires larger gaps to be designed in between the mirrors in the array, reducing the active reflection area fill-ratio. For example, if the rotation of the mirror in each direction is 12°, every one micron between the mirror and the yoke results in 0.2 microns horizontal displacement in each direction. In other words, more than 0.4 microns spacing between adjacent mirrors is required for every one micron length of mirror support post to accommodate the horizontal displacement. The yoke structure can limit the electrostatic efficiency of the capacitive coupling between the bottom electrodes and the yoke and mirror. In a landing position, the yoke structure requires a high voltage potential between the electrodes and the yoke and mirror to enable rotation or angular crossover transition.

Another type of reflective SLM device includes an upper optically transmissive substrate held above a lower substrate containing addressing circuitry. Two hinge posts from the upper substrate suspend one or more electrostatically deflectable elements. In operation, individual mirrors are selectively deflected and serve to spatially modulate light that is incident to, and then reflected back through, the upper transmissive substrate. Motion stops may be attached to the reflective deflectable elements so that the mirror does not snap to the bottom control substrate. Instead, the motion stops rest against the upper transmissive substrate thus limiting the deflection angle of the reflective deflectable elements.

In such a top hanging mirror design, the mirror hanging posts and mechanical stops are all exposed to the illumination light, which reduces the active reflection area fill-ratio and optical efficiency, and increases light scattering. It is also difficult to control the smoothness of the reflective mirror surfaces, which is often sandwiched between deposited aluminum film and LPCVD silicon nitride layers. Film quality determines the roughness of reflective aluminum surfaces. No post-polishing can be done to correct the mirror roughness.

It would be highly desirable to provide a high contrast SLM device that overcomes the foregoing shortcomings.

SUMMARY

The present disclosure provides a high contrast SLM device comprising a high active reflection area fill-ratio and non-diffractive micro mirror array and a high electrostatic efficiency and low surface adhesion control substrate. The modulator includes a mirror plate that has a three-layer sandwich structure. Methods for making the modulator are also described.

In one aspect, an SLM device is described having a control substrate having an upper portion with a plurality of electrodes connected to functional circuitry, a support post on the control substrate and a mirror plate supported by the support post. The mirror plate has an upper reflective surface, a spacer layer and a lower conductive portion, wherein each of the upper reflective surface, spacer layer and lower conductive portion have a different material composition from one another.

Implementations of the SLM can include one or more of the following features. The lower conductive portion can include a hinge, a pair of support posts can support the hinge and the mirror plate can rotate about the hinge. The spacer layer can include or consist of amorphous silicon and the lower conductive portion can include a metal. The lower conductive portion can include or consist of titanium or a titanium alloy. The upper reflective surface can include aluminum. The upper reflective layer can have a thickness of approximately 400 angstroms or less and be selected from the group of metals consisting of aluminum, gold, and combinations thereof. The lower conductive portion can be one of tantalum, tungsten, molybdenum, nickel or their alloys or a silicide of one of the aforementioned materials. The device can include an upper reflective layer of aluminum, a spacer layer of amorphous silicon and a lower conductive portion of titanium. The spacer layer can include a low temperature deposited material. The mirror plate can have a thickness of between about 3000 and 5000 angstroms or between about 1000 and 3000 angstroms. The spacer layer can have a thickness of between about 1000 and 2000 angstroms or about 2000 and 5000 angstroms thick. A lubricating layer can be on the lower conductive portion.

In one general aspect, an SLM is described having pairs of torsion hinges embedded under cavities that are part of the lower portion of a mirror plate. The hinges are a minimum distance from the reflective surface. The cavity provides a gap for a predetermined angular rotation of the mirror. Each mirror in the array is suspended by a pair of torsion hinges supported by two posts, so each mirror rotates along an axis in the mirror plane. By eliminating the horizontal displacement of an individual mirror during the rotation, the gaps between adjacent mirrors in the array are significantly reduced, which results in a very high active reflection area fill-ratio of the SLM device.

In another general aspect, an SLM is described that has a pair of vertical landing tips fabricated on the surface of a control substrate. These vertical landing tips reduce the contact area of the mirrors during a mechanical stop, and improve the reliability of mechanical landing operation. Most importantly, these landing tips enable a separation of the mirror from its landing position by applying a sharp bipolar pulsing voltage on the landing tip of the mirror array. The kinetic energy of the electromechanical shock generated by bipolar pulsing is converted into the elastic strain energy stored in the deformed mirror hinges and deformed landing tips, and is later released to spring and bounce the mirror from the landing tips.

In another general aspect, an SLM is described having step electrodes raised above the surface of control substrate to narrow the gap between the mirrors and the addressing electrodes near hinge areas. Smaller effective gap spacing, especially at a mechanical stop position, enhances electromechanical latching and improves electrostatic efficiency.

In another general aspect, an SLM is described that has a coating an anti-stiction layer on the device structures, which reduces the surface contact adhesion between the mirror plate and landing tips.

In another general aspect, an SLM is described where the mirror plates, embedded torsion hinges, support posts, step electrodes, and landing tips are made of aluminum and/or silicon based electromechanical materials, for example, aluminum, silicon, amorphous silicon, polysilicon, and aluminum-silicon alloys. Deposition of the material is accomplished by physical vapor deposition (PVD) of magnetron sputtering a single target containing either or both aluminum and silicon in a controlled environment at a temperature below 500° C. Same structure layers may also be formed by plasma-enhanced chemical vapor deposition (PECVD).

In another general aspect, an SLM is described where the materials of the mirror plates, embedded torsion hinges, support posts, electrodes, and vertical landing tips are refractory-metal based electromechanical materials, for example, titanium, tantalum, tungsten, molybdenum, and their silicides. Refractory metals and their silicides are compatible with CMOS semiconductor processing and have relatively good mechanical properties. These materials can be deposited by PVD, chemical vapor deposition (CVD), and PECVD. Depositing a metallic thin-film, such as aluminum, gold or their alloys, on the surfaces of mirror plate, may enhance the optical reflectivity.

Particular embodiments of the invention can be implemented to realize one or more of the following advantages. The invention can provide a high contrast spatial light modulator for display and printing. The invention can couple a high active reflection area fill-ratio and non-diffractive micro-mirror array with a high electrostatic efficiency and low surface adhesion control substrate. By virtue of their structures, mirrors of modulators in accordance with the invention can have an ability to resist deformation caused by, for example, thin film mechanical stresses and thermal stresses.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

FIGS. 23-26 are cross-sectional side views of a part of a spatial light modulator; the figures illustrate one method for forming reflective mirrors and releasing individual mirrors of a micro-mirror array.

DETAILED DESCRIPTION

A high contrast SLM device for display and printing is fabricated by coupling a high active reflection area fill-ratio and non-diffractive micro-mirror array with a high electrostatic efficiency and low surface adhesion control substrate.

Figure 1A:
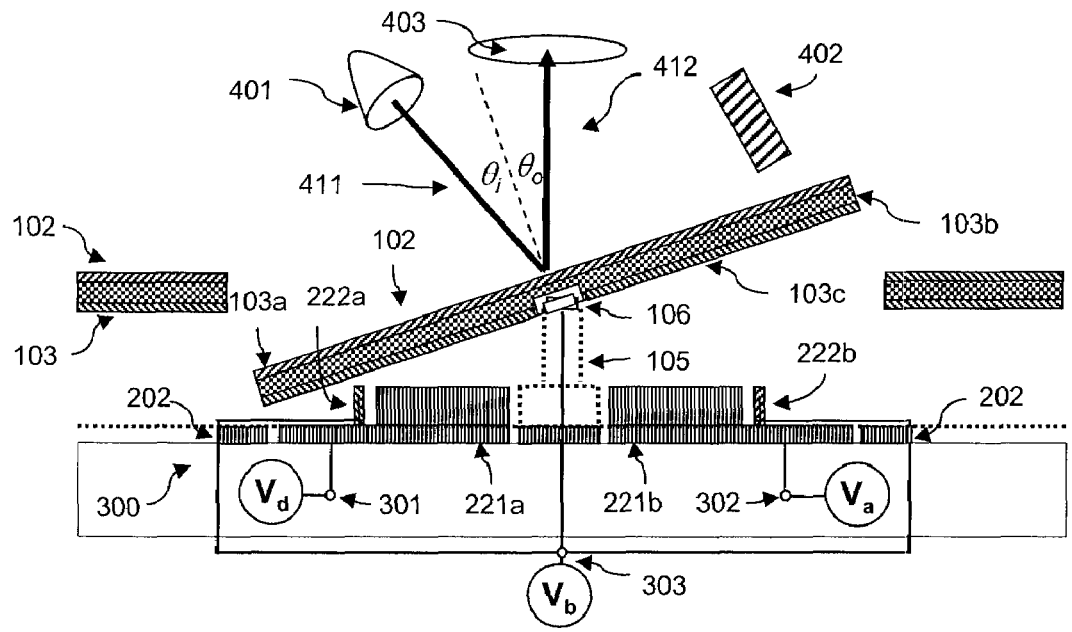
FIG. 1a is a cross-sectional view of a portion of a spatial light modulator deflecting light to an "on" state.

A cross-sectional view of a unit of one embodiment of an SLM is shown in FIG. 1a. The SLM device usually includes additional SLM units similar to the one depicted. A mirror plate 102 is tilted on a hinge 106 toward an electrode 221a. Illumination light 411 from an illumination source 401 forms an angle of incidence $\theta_i$. Deflected light 412 has an angle of $\theta_o$, as measured in a direction normal to the top surface of the mirror plate 102. In a digital operation mode, this configuration is commonly called the "on" position.

Figure 1B:
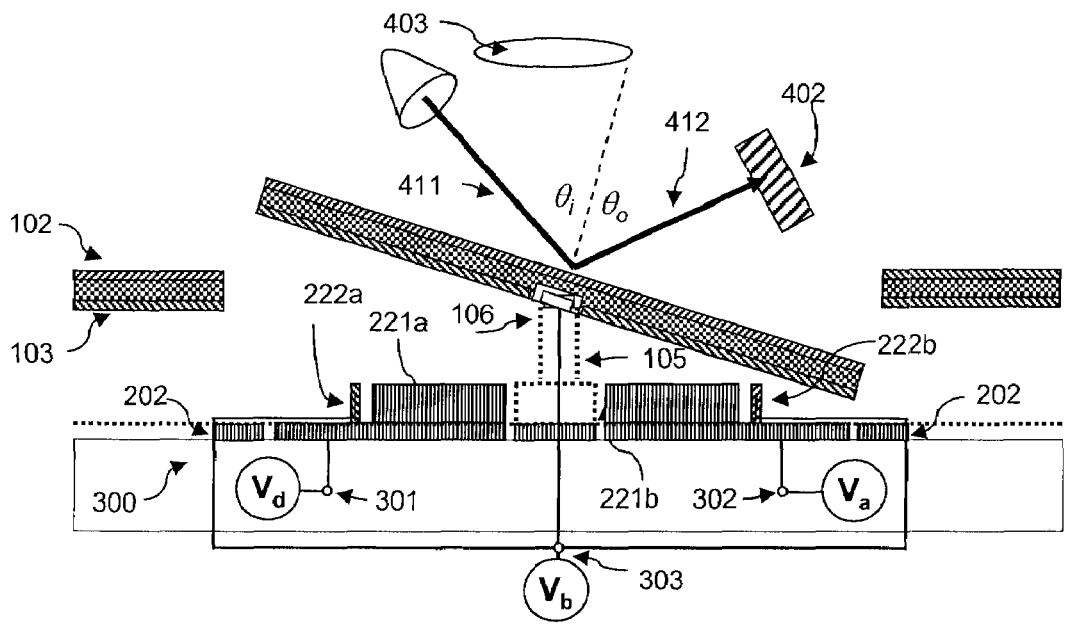
FIG. 1b is a cross-sectional view of a portion of a spatial light modulator deflecting light to an "off" state.

FIG. 1b shows a cross-sectional view of the same SLM unit while the mirror plate is rotated toward electrode 221b on the other side of the hinge 106 and under the mirror plate 102. The illumination light 411 and deflected light 412 form much larger angles $\theta_i$ and $\theta_o$ than they do when the SLM unit is in the "on" position. These angles are a function of the dimensions of mirror plate 102 and the gap between the lower surface of mirror plate 102 and the top surfaces of vertical landing tips 222a and 222b. The deflected light 412 exits toward a light absorber 402.

In the implementation shown in FIGS. 1a and 1b, the mirror plate 102 includes three thin film layers. Each of the thin film layers has a material composition that is different from an adjacent layer. A reflective top layer 103a is made of a reflective material, such as aluminum, and is between about 500 and 1000 angstroms thick, such as about 600 angstroms thick. In some embodiments, the reflective top layer 103a is less than 500 angstroms thick, such as less than 400 angstroms thick. In some embodiments, the top layer 103a consists of aluminum or gold. A middle layer 103b made of a silicon-based material, for example, low temperature amorphous silicon, and is between about 1000 to 5000 angstroms thick, such as between about 1000 and 2000 angstroms thick. In some embodiments, the middle layer 103b consists of, or essentially of, silicon, such as amorphous silicon. Alternatively, the middle layer 103b can include another low temperature deposited material, such as a material that is deposited by PVD or sputtered, including one or more of nickel, titanium, tantalum, tungsten or molybdenum. A bottom layer 103c is made of a conductive material, such as titanium or a titanium alloy, and can be between 100 to 1000 angstroms thick, such as about between about 500 to 600 angstroms thick. A suitable titanium alloy can include aluminum or nickel. Yet another suitable material for the bottom layer 103c is highly doped conductive amorphous silicon. In some embodiments, the bottom layer 103c consists of, or consists essentially of, titanium or a titanium alloy. As can be seen from FIGS. 1a and 1b, the hinge 106 can be implemented as part of the bottom layer 103c. The three layer thin film mirror can have a total thickness of between about 1000 and 5000 angstroms, such as between about 2000 and 3000 angstroms or between about 3000 and 5000 angstroms. The mirror plate 102 can be fabricated as described herein.

According to another embodiment, an SLM device includes three major portions: a bottom portion including control circuitry, a middle portion with sets of step electrodes, micro landing tips, hinge support posts, and an upper portion covered with a set of mirrors with associated embedded torsion hinges and cavities.

The bottom portion is a wafer substrate 300 with addressing circuitry to selectively control the operation of each mirror in the micro-mirror array of the SLM device. The addressing circuitry includes an array of memory cells and word-line/bit-line interconnects for communicating signals. The electrical addressing circuitry is on a silicon substrate and may be fabricated using standard CMOS technology. The circuitry resembles a low-density memory array.

The middle portion of the high contrast SLM is formed with electrodes, such as, electrodes 221a and 221b, vertical landing tips, such as, landing tips 222a and 222b, hinge support posts, such as, hinge support post 105, and a support frame 202. The electrodes 221a and 221b can be step electrodes. Specifically, an electrode can be shaped like stair steps and thus include top surfaces of different heights or levels. The height differences between the top surfaces of a step electrode can vary from 0.2 microns to 3 microns depending on the relative height of the gap between the first level electrodes to the mirror plate. The multi-level step electrodes of the present invention are designed to improve the capacitive coupling efficiency of electrostatic torques during the rotation or angular cross over transition. By raising the top surface of a step electrode at the end that is proximate the hinge, the gap between the bottom surface of a mirror plate and the top surfaces of the step electrode is effectively narrowed. Since the electrostatic attractive force is inversely proportional to the square of the distance between the mirrors and electrodes, the effect becomes apparent when the mirror is tilted at its landing positions. When operating in an analog mode, highly efficient electrostatic couplings allow more precise and stable control of the tilting angles of the individual micro-mirrors in the SLM device. In a digital mode, lower driving voltage may be required for the addressing circuitry to operate.

A pair of stationary vertical landing tips 222a and 222b are on the surface of the control substrate. For ease of manufacturing, the tips can have the same height as the height of the highest top surface of a step electrode. The stationary vertical landing tips 222a and 222b have two functions. The vertical landing tips provide a gentle mechanical touchdown for the mirror to land on each angular crossover transition. Adding stationary vertical landing tip 222a and 222b on the surface of the control substrate enhances the robotic operation and prolongs the reliability of the device. The second function of these vertical landing tips 222a and 222b is to ease separation between the mirror plate 102 and its contact stop. The contact surface adhesion between a mirror and a micro tip is less than between a mirror edge and an electrode during digital operation of an SLM. Additionally, a voltage pulse can be applied to the plate and tip to overcome stiction. For example, to initiate rotation, a sharp bipolar voltage pulse Vb is applied on electrode 303, which is connected to each mirror plate 102 through its embedded hinges 106 and support posts 105. The voltage established by the bipolar voltage pulse Vb enhances the electrostatic forces on both sides of the hinge 106. This strengthening is unequal on two sides at the landing position, due to the large difference in gap spacing. Though the increases of voltage pulse Vb on the lower surface of mirror plate 102 has less impact on which direction the mirror plate 102 will rotate toward, a sharp increase of electrostatic forces F on the whole mirror plate 102 provides a dynamic excitation by converting the electromechanical kinetic energy into an elastic strain energy stored in the deformed mirror hinges 106 and deformed vertical landing tips 222a or 222b. After the bipolar pulse is released, the elastic strain energy of deformed vertical landing tip 222a or 222b and deformed mirror hinges 106 is converted back to the kinetic energy of mirror plate as it springs and bounces away from the vertical landing tip 222a or 222b. This perturbation of the mirror plate toward the quiescent state enables a much smaller address voltage potential Va for angular cross over transition of the mirror plate 102 from one state to the other.

Hinge support frame 202 on the surface of control substrate 300 is designed to strengthen the mechanical stability of the pairs of mirror support posts 105, and retain the electrostatic potentials locally. For ease of manufacturing, the height of support frames 202 can be the same as the lowest top surface of step electrodes 221a and 221b. With a fixed size of mirror plate 102, the height of a pair of hinge support posts 105 determines the maximum deflection angles θ of a micro-mirror array.

The upper portion of the high contrast SLM is fully covered by arrays of mirror plates 102 with a flat optically reflective layer on the upper surfaces and a pair of embedded torsion hinges 106 under the cavities in the lower portion of mirror plate 102. Torsion hinges 106 in the mirror plate 102 are fabricated to be part of the mirror plate 102 and are kept a minimum distance from the reflective surface to allow only a gap for a pre-determined rotation. By minimizing the distance between the rotating axis of hinge 106 and the upper reflective surface of top reflective layer 102, the spatial light modulator effectively eliminates the horizontal displacement of each mirror during an angular transition form one state to another. According to the present invention, the gaps between adjacent mirrors in the array of the SLM device can be reduced to less than 0.2 microns to achieve a high active reflection area fill-ratio.

The materials used for SLMs are preferably conductive and stable, with suitable hardness, elasticity, and stress. In one implementation, a single material, such as an electromechanical material, will supply both the stiffness of portions of the mirror plate 102 and plasticity of torsion hinges 106 and have sufficient strength to deflect without fracturing. Different materials can be used for each layer of the mirror plate. For example, the top reflective layer can be made of aluminum and the hinge can be made of titanium. Furthermore, all the materials used in constructing the micro-mirror array are preferably processed under 400° C., a typical manufacturing process temperature to avoid damaging the pre-fabricated circuitries in the control substrate.

According to another embodiment of the present invention, the middle layer and the top layer of the mirror plate 102 and the support posts 105 are made of aluminum or silicon based electromechanical materials, such as aluminum, silicon, amorphous silicon, polysilicon, and aluminum-silicon alloys, and their alloys. In some embodiments, the support posts 105 consist of amorphous silicon. In some embodiments, the support posts consist of one of the other aluminum or silicon materials listed herein. In one embodiment, deposition is accomplished by PVD magnetron sputtering of a single target containing either or both aluminum and silicon in a controlled chamber with temperature below 500° C. Same structure layers may also be formed by PECVD.

According to another embodiment, the bottom layer of the mirror plate 102 and the recessed torsion hinges 106 are made of metal thin films based electromechanical materials, such as titanium, tantalum, tungsten, molybdenum, nickel, their silicides, and their alloys. In some embodiments, the bottom layer of the mirror plate 102 and the torsion hinges 106 consist of one of the refractory metals, their silicides or their alloys. Refractory metals and their silicides are compatible with CMOS semiconductor processing and have relatively good mechanical properties. These materials can be deposited by PVD, CVD, and PECVD.

In some embodiments of the mirror plate 102, the optical reflectivity is enhanced by further depositing a layer of metallic thin-film on to the middle or spacer layer. Suitable reflective materials include aluminum, gold, and their alloys, depending on the applications of the surfaces of mirror plate 102.

To achieve a high contrast ratio of the deflected video images, any scattered light from a micro-mirror array should be reduced or eliminated. A common interference comes from the diffraction patterns generated by the scattering of illumination from the leading and trailing edges of individual mirrors. A solution to the diffraction problem is to weaken the intensity of a diffraction pattern and to direct the scattered light from the inactive area of each pixel in different directions away from the projection pupil. One method is directing the incident light 411 45° to the edges of the square mirror plate 102 pixels, which is sometimes called a diagonal hinge or diagonal illumination configuration.

Figure 2:
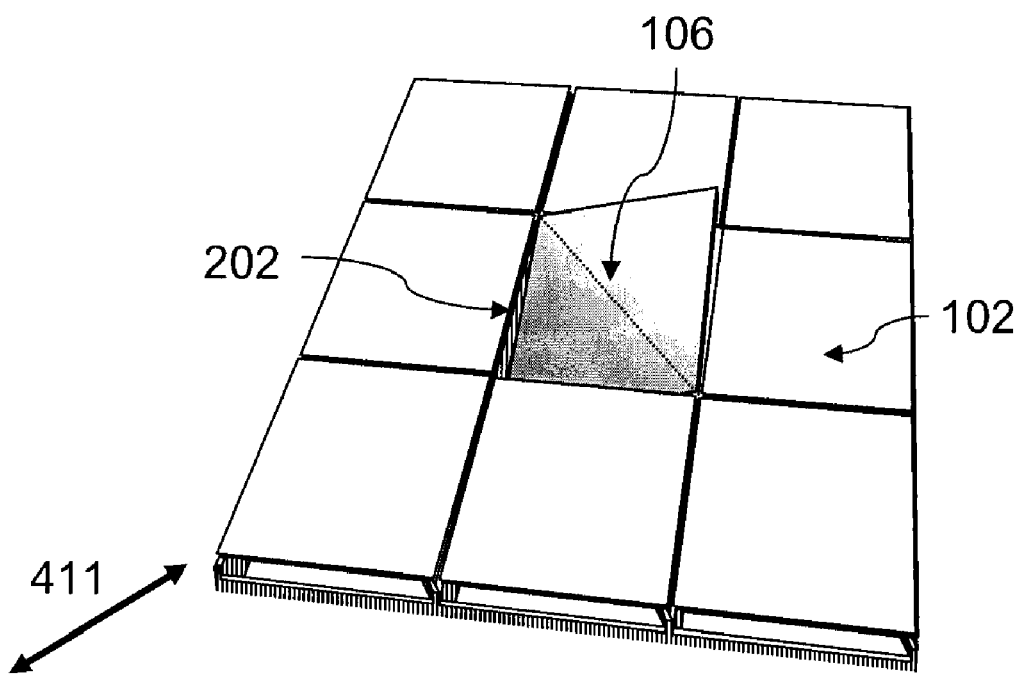
FIG. 2 is a perspective view of a portion of an array of rectangular shaped mirrors of a projection system with diagonal illumination.

FIG. 2 is a perspective view showing the top of a part of the mirror array with each mirror plate 102 having a square shape; this mirror uses a diagonal illumination system. The hinges 106 of the mirrors in the array are fabricated in a diagonal direction along two opposite corners of each mirror and perpendicular to the light of illumination 411. The advantage of a square mirror with a diagonal hinge axis is its ability to deflect the scattered light from the leading and trailing edges 45° away from the projection pupil 403. The disadvantage is that it requires the projection prism assembly system to be tilted with respect to the edge of the SLM. The diagonal illumination has a low optical coupling efficiency when a conventional rectangular total internal reflection (TIR) prism system is used to separate the "on" and "off" light selected by each mirror 102. The twisted focusing spot requires an illumination larger than the size of rectangular micro-mirror array surfaces in order to cover all active pixel arrays. A larger rectangular TIR prism increases the cost, size, and the weight of the projection display.

Figure 3:
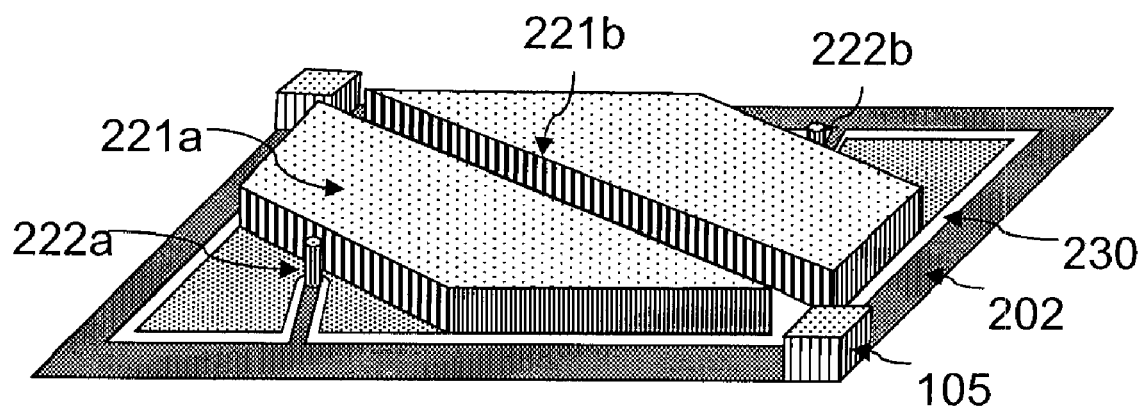
FIG. 3 is a perspective view showing the top of a part of a control circuitry substrate for a projection system with diagonal illumination.

A perspective view of the top of a part of the control circuitry substrate for the projection system with a diagonal configuration is shown in FIG. 3. The pair of step electrodes 221 is arranged diagonally to improve the electrostatic efficiency of the capacitive coupling to the mirror plate 102. The two micro vertical landing tips 222a and 222b act as the landing stops for a mechanical landing of mirror plate 102 to ensure the precision of tilted angle θ and to overcome contact stiction. Made of high spring constant materials, these micro vertical landing tips 222a and 222b act as landing springs to reduce the contact area when the mirrors are snapped down. Another function of these micro vertical landing tips 222a and 222b at the edge of the two-level step electrodes 221 is their spring effect which facilitates separation from the mirror plate 102. When a sharp bipolar voltage pulse Vb is applied on the mirror plate 102 through a common electrode 303 of the mirror array, a sharp increase of electrostatic forces F on the whole mirror plate 102 provides a dynamic excitation by converting the electromechanical kinetic energy into an elastic strain energy stored in the deformed mirror hinges 106. The elastic strain energy is converted back to the kinetic energy of mirror plate 102 as it springs and bounces away from the vertical landing tips 222a and 222b.

The periodic array of the straight or corner shape edges of the mirrors in conventional SLMs can create diffraction patterns that reduce the contrast of projected images by scattering the illumination light 411 at a fixed angle. Curved leading and trailing edges of mirrors in the array can generate much weaker diffraction patterns due to the variation of scattering angles of the illumination light 411 on the edges of the mirrors. According to some embodiments, the reduction of the diffraction intensity into the projection pupil 403 while maintaining an orthogonal illumination optics system is achieved by replacing the straight edges of a rectangular mirror with at least one or a series of curved leading and trailing edges with opposite recesses and extensions. Forming curved leading and trailing edges that are perpendicular to the incident illumination 411 weakens the diffraction intensity and reduces a large portion of the scattered light that is diffracted directly into the projection system.

In some embodiments, the axis of rotation for the mirror plate is orthogonal to edges of the mirror plate rather that diagonal to the edges of the mirror plate. Orthogonal illumination can have a higher optical system coupling efficiency as compared to a diagonally configured mirror, and may require a less expensive, smaller size, and lighter TIR prism. However, since the scattered light from both leading and trailing edges of a mirror is scattered directly into the projection pupil 403, it can create diffraction patterns that reduce the contrast ratio of an SLM device.

Figure 4:
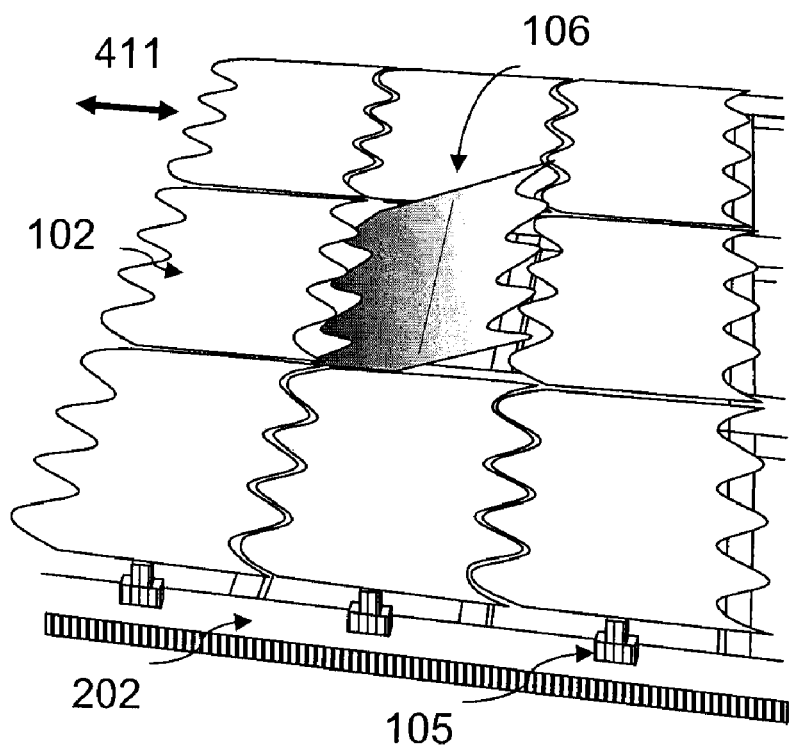
FIG. 4 is a perspective view showing a portion of a mirror array where each mirror has a series curved leading and trailing edges for use in a projection system with orthogonal illumination.

FIG. 4 shows a perspective view of the top of a mirror array for a projection system with orthogonal illumination. The embedded torsion hinges 106 are parallel to the leading and trailing edges of each mirror and are perpendicular to the illumination light 411. Thus, the mirror pixels in the SLM device are illuminated orthogonally. Each mirror in the array has a series of curves on the leading edge and trailing edge. As described above, the principle is that an edge with curves weakens the diffraction intensity of scattered light and diffracts a large portion of scattered light at a variety of angles away from the optical projection pupil 403. The radius of curvature of the leading and trailing edges of each mirror r may vary depending on the number of curvatures selected. As the radius of curvature r becomes smaller, the diffraction reduction effect becomes more prominent. To maximize the diffraction reduction, according to some embodiment, a series of small radius curves r are designed to form the leading and trailing edges of each mirror in the array. The number of curves may vary depending on the size of the mirror plates, with a 10 micron square mirror plate, two to four curves on each leading and trailing edge provides optimum results and low diffraction.

Figure 5:
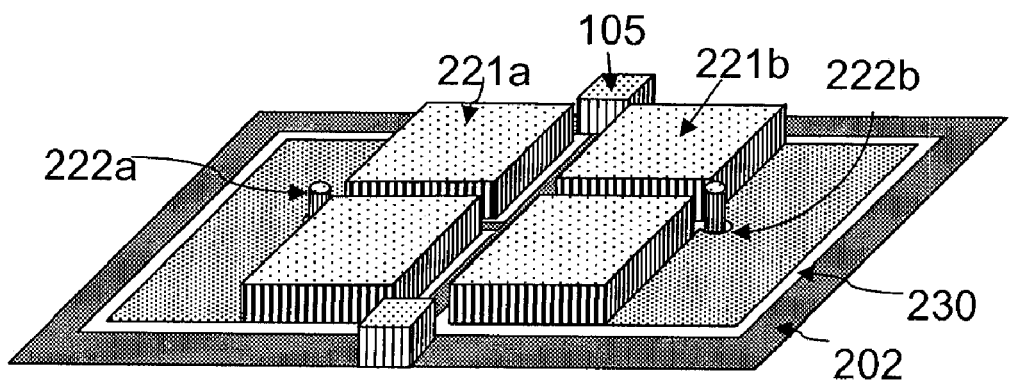
FIG. 5 is a perspective view of a control circuit substrate for a projection system with orthogonal illumination.

FIG. 5 is a perspective view of a part of the control circuitry substrate for a projection system with orthogonal illumination. Unlike conventional flat electrodes, the two-level step electrodes 221a and 221b raised above the surface of control substrate near the hinge axis narrows the effective gap between the flat mirror plate 102 and the bottom step electrodes 221a and 221b, which significantly enhances the electrostatic efficiency of capacitive coupling of the mirror plate 102. The number of levels for the step electrodes 221a and 221b can vary from one to ten. However, the larger the number of levels for step electrodes 221a and 221b, the more complicated and costly it can be to manufacture the device. A more practical number is two or three. FIG. 5 also shows the mechanical landing stops made of vertical landing tips 222a and 222b, which are perpendicular to the surface of control substrate. These vertical landing tips 222a and 222b provide a mechanical stop during the landing operation of angular crossover transitions. The vertical landing tips 222a and 222b at the edge of step electrodes 221a and 221b act as landing tips to further overcome the contact surface adhesion. This low voltage driven and high efficiency micromirror array design allows an operation of a larger total deflection angle ($|\theta|>15°$) of the micro-mirrors, which enhances the brightness and contrast ratio of the SLM device.

Figure 6:
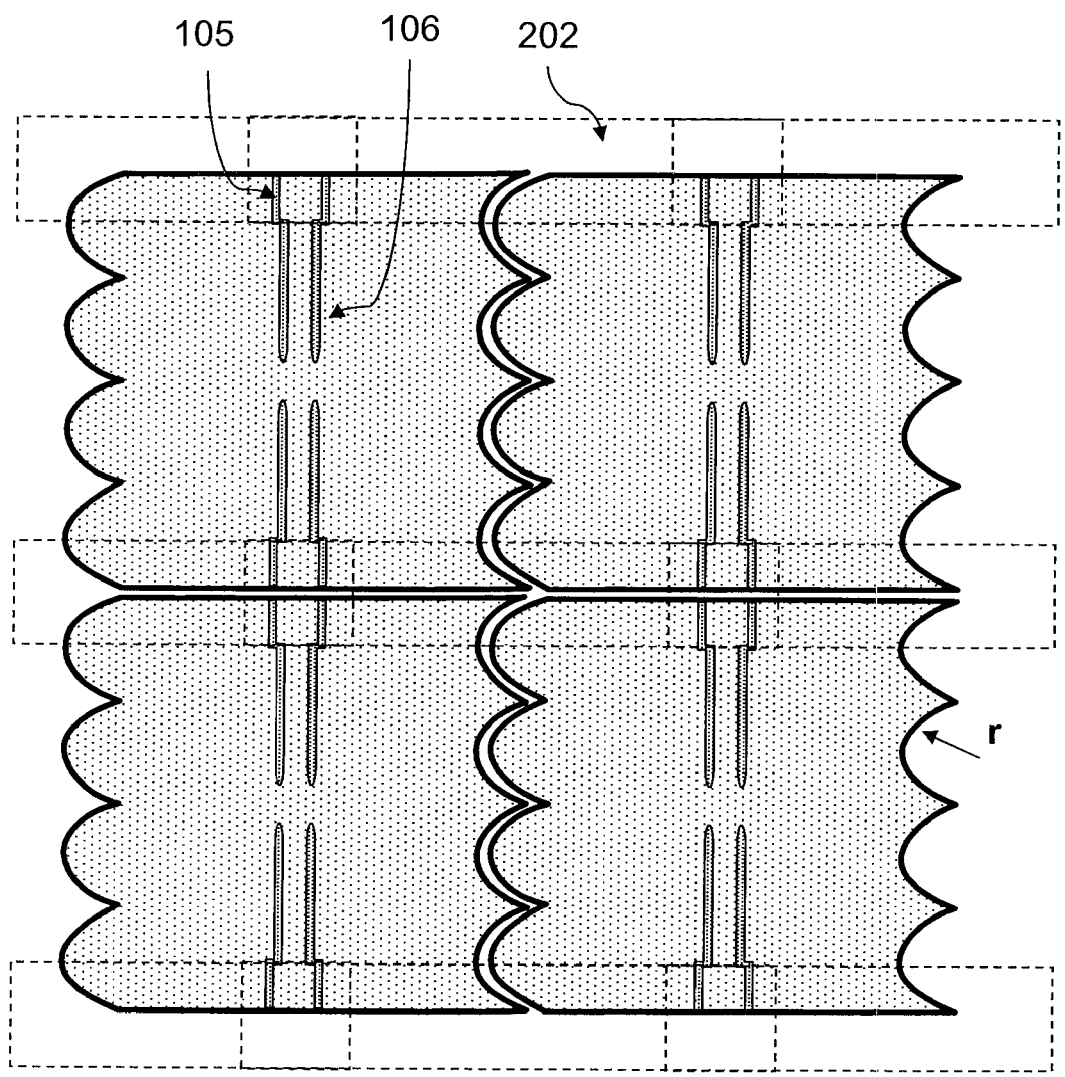
FIG. 6 is an enlarged backside view of a portion of a mirror array where each mirror has a series of curved leading and trailing edges for a projection system with orthogonal illumination.

An advantage of this reflective spatial light modulator is that it produces a high active reflection area fill-ratio by embedding the torsion hinge 106 under the cavities in the lower portion of mirror plate 102. The embedded hinge almost completely eliminates the horizontal displacement of the mirror plate 102 during rotation. An enlarged backside view of a part of the mirror array designed to reduce diffraction intensity using four-curve leading and trailing edges for a projection system with an orthogonal illumination configuration is shown in FIG. 6. Again, pairs of torsion hinges 106 are embedded under two cavities as part of the lower layer 103c of mirror plate 102 and are supported by a pair of support posts 105 on top of support frames 202. Hinge support post 105 has a width W larger than the width of torsion hinge 106. Because the distance between the axis of hinge 106 and the reflective surface of the mirror is kept at a minimum, a high active reflection area fill-ratio is achieved by closely packing individual mirrors without interference from about the horizontal displacement. In one embodiment, mirror pixel size (a×b) is about 10 microns×10 microns, while the radius of curvature r is about 2.5 microns.

Figure 7:
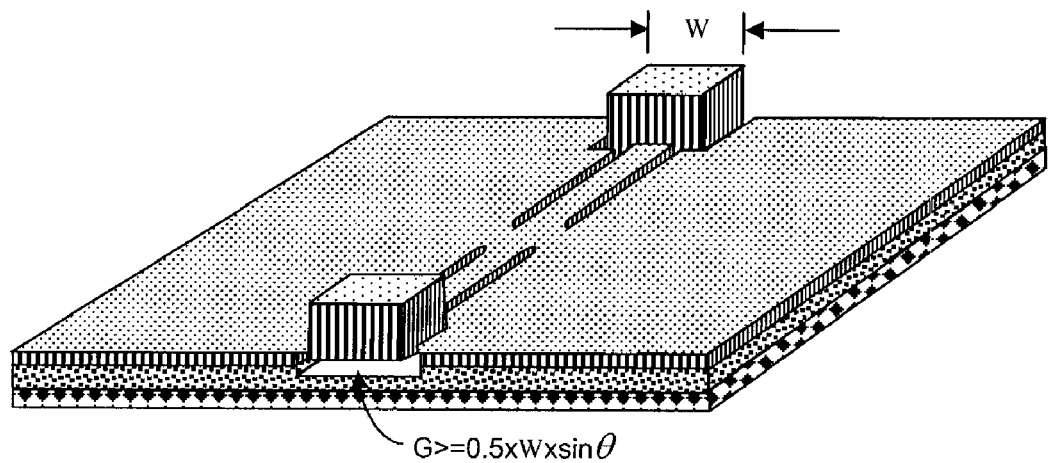
FIG. 7 is a perspective view of embedded torsion hinges and their support posts under cavities in the lower portion of a mirror plate.

FIG. 7 shows an enlarged prospective backside view of a part of the mirror plate showing the embedded torsion hinge 106 and their support posts 105 under cavities in the lower portion of a mirror plate 102. To achieve optimum performance, it is important to maintain a minimum gap G in the cavity where the embedded torsion hinges 106 are created. The dimension of the hinges 106 varies depending on the size of the mirror plates 102. In one embodiment, the dimension of each torsion hinge 106 is about 0.1×0.2×3.5 microns, while the support post 105 has a square cross-section with each side W having about a 1.0 micron width. Because the top surfaces of support posts 105 are also under the cavities as a lower part of the mirror plate 102, the gap G in the cavity needs to be large enough to accommodate the angular rotation of mirror plate 102 without touching the larger hinge support posts 105 at a predetermined angle θ. In order for the mirror to rotate a pre-determined angle θ without touching the hinge support post 105, the gap of the cavities where torsion hinges 106 are embedded must be larger than $G=0.5 \times W \times SIN(\theta)$, where W is the cross sectional width of hinge support posts 105.

Figure 8:
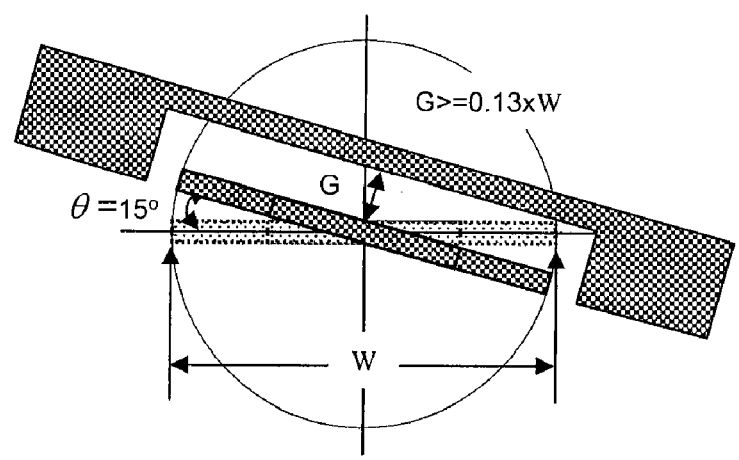
FIG. 8 is a diagram illustrating a minimum gap spacing around an embedded torsion hinge of a mirror plate when rotated 15° in one direction.

FIG. 8 is a diagram illustrating a minimum gap G around the embedded torsion hinge 106 of a mirror plate 102 when rotated 15° in one direction. The calculation indicates that the gap G of torsion hinge 106 in the cavity must be larger than $G=0.13W$. If the width of each side W of a square hinge support post 105 is 1.0 micron, the gap G in the cavity should be larger than 0.13 microns. Without horizontal displacement during rotation, the horizontal gap between the individual mirrors in the micro-mirror array may be reduced to less than 0.2 microns, which leads to a 96% active reflection area fill-ratio of the SLM device.

According to some embodiments, a high contrast spatial light modulator can be fabricated using the following techniques. A control silicon substrate is formed with support frames and arrays of first level electrodes on the surface. The electrodes are connected to memory cells in the substrate, which resembles a low-density memory array. A set of second level electrodes, micro landing tips, and hinge support posts are formed on the surface of the control substrate. A set of mirrors is then formed with embedded hidden hinges where each mirror is on a pair of support posts. The fabricated substrate is separated into individual spatial light modulation device dies before finally removing the remaining sacrificial materials.

Figure 9:
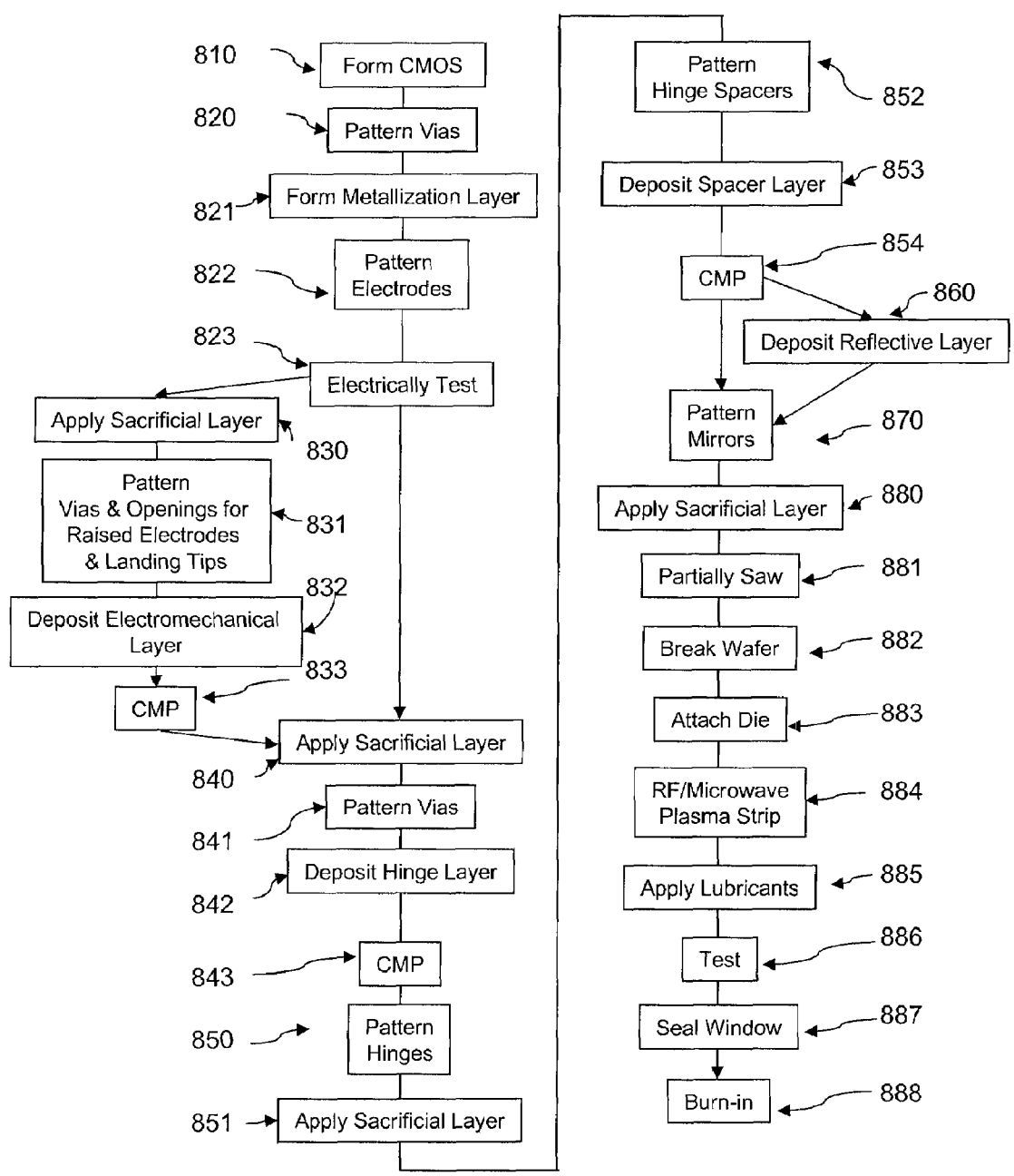
FIG. 9 is a manufacturing process flow diagram for a high contrast spatial light modulator.

One embodiment of the manufacturing process flow diagram for a high contrast spatial light modulator is shown in FIG. 9. The manufacturing process starts with fabricating a CMOS circuitry wafer having a set of memory cells and word-line/bit-line interconnection structures for communicating signals using common semiconductor technology 810. This step forms the control substrate. A set of first level electrodes and support frames are then formed by patterning vias through a passivation layer of the circuitry, opening up addressing nodes in the control substrate 820. To enhance adhesion for a subsequent electromechanical layer, the via and contact openings are exposed to 2000 watts of RF or microwave plasma with 2 torr total pressures of a mixture of $O_2$, $CF_4$, and $H_2O$ gases at a ratio of 40:1:5 at about 250° C. for less than five minutes. An electromechanical layer is deposited by physical vapor deposition (PVD) or plasma-enhanced chemical vapor deposition (PECVD), depending on the materials selected for filling the vias and forming an electrode layer on the surface of control substrate 821. Then, the electromechanical layer is patterned and etched anisotropically through to form a plurality of electrodes and support frames 822. The partially fabricated wafer is tested 823 to ensure the electrical functionality.

According to one embodiment, the electromechanical layer is a metal which can take the form of a pure aluminum (Al), titanium, tantalum, tungsten, molybdenum film, an Al/poly-Si composite, an Al—Cu alloy, or an Al—Si alloy. While each of these metallizations has slightly different etching characteristics, they all can be etched in similar chemistry to plasma etching of Al. A two step process can be carried out to etch metallization layers anisotropically. First, the wafer is etched in inductively coupled plasma while flowing with $BC_{13}$, $C_{12}$, and Ar mixtures at flow rates of 100 sccm, 20 sccm, and 20 sccm, respectively. The operating pressure is in the range of 10 to 50 mTorr, the inductively coupled plasma bias power is 300 watts, and the source power is 1000 watts. During the etching process, the wafer is cooled with a backside helium gas flow of 20 sccm at a pressure of 1 Torr. Since the Al pattern cannot simply be removed from the etching chamber into ambient atmosphere, a second oxygen plasma treatment step is performed to clean and passivate the Al surfaces. In a passivation process, the surfaces of partially fabricated wafers are exposed to a 2000 watts of RF or microwave plasma with 2 torr of a 3000 sccm of $H_2O$ vapor at about 250° C. temperatures for less than three minutes.

According to some embodiments, the electromechanical layer is a silicon based material, which can take the form of a amorphous silicon, polysilicon, polycides, or a silicide. While each of these electromechanical layers has slightly different etching characteristics, they all can be etched in similar chemistry to plasma etching of amorphous silicon or polysilicon. Anisotropic etching of amorphous silicon or polysilicon can be accomplished with most Cl and F based feedstocks, such as $Cl_2$, $BCl_3$, $CF_4$, $NF_3$, $SF_6$, HBr, and their mixtures with Ar, $N_2$, $O_2$, and $H_2$. The polysilicon or silicide layer ($WSi_x$, or $TiSi_x$, or TaSi) is etched anisotropically in inductively decoupled plasma while flowing with $Cl_2$, $BCl_3$, HBr, and $HeO_2$ gases at flow rates of 100 sccm, 50 sccm, 20 sccm, and 10 sccm respectively. In another embodiment, a polycide layer is etched anisotropically in a reactive ion etch chamber flowing with $Cl_2$, $SF_6$, HBr, and $HeO_2$ gases at a flow rate of 50 sccm, 40 sccm, 40 sccm, and 10 sccm respectively. In both cases, the operating pressure is in the range of 10 to 30 mTorr, the inductively coupled plasma bias power is 100 watts, and the source power is 1200 watts. During the etching process, the wafer is cooled with a backside helium gas flow of 20 sccm at a pressure of 1 Torr. A typical etch rate can reach 9000 angstroms per minute.

In order to improve the electrostatic efficiency and reduce stiction during the rotation of the micro-mirrors, a plurality of second level electrodes and micro landing tips are fabricated on the surfaces of control substrate. First, a layer of sacrificial materials is deposited with a predetermined thickness on the surface of partially fabricated wafer 830. If the sacrificial material is photoresist, the layer is spin coated on the surface. If it is organic polymer, the layer is deposited by PECVD. To prepare for the subsequent build up, the sacrificial layer is hardened by exposing the layer to ultraviolet light, exposing the layer to a $CF_4$ plasma for about three minutes, baking the layer at about 150° C. for about two hours, and exposing the layer to oxygen plasma for about one minute. Second, the sacrificial layer is patterned to form via and contact openings for a plurality of second level electrodes, landing tips, and support posts 831. Third, a second electromechanical layer is deposited by PVD or PECVD depending on the materials selected, forming a plurality of second level electrodes, landing tips, and support posts 832. Finally, the second electromechanical layer is planarized to a predetermined thickness by chemical mechanical polishing (CMP) 833. The second level electrodes and micro landing tips can have a height of less than one micron.

Once the raised multi-level step electrodes and micro landing tips are formed on the CMOS control circuitry substrate, a plurality of mirrors with embedded hidden hinges on each pair of support posts are fabricated. The process starts with depositing sacrificial materials with a predetermined thickness on the surface of a partially fabricated wafer 840. Then sacrificial layer is patterned to form vias for a plurality of hinge support posts 841. The sacrificial layer is further hardened before depositing electromechanical or conductive or semiconductive materials by PVD or PECVD, depending on materials selected to fill vias and form a thin layer for torsion hinges and part of the mirrors 842. The deposition is done by either PECVD or PVD depending on the materials selected. For the materials selected from the group consisting of aluminum, titanium, tungsten, molybdenum, nickel and their alloys, PVD is a suitable deposition method. For the materials selected from the group consisting of silicon, amorphous silicon, polysilicon, silicide, polycide, tungsten, and their combinations, PECVD is chosen as a method of deposition. Chemical Mechanical Polishing (CMP) is used to planarize the electromechanical layer to a predetermined thickness 843.

The electromechanical layer is patterned with a plurality of openings to form a plurality of torsion hinges 850. To form a plurality of cavities in the lower portion of mirror plate and torsion hinges embedded under the cavity, sacrificial materials are again deposited to fill the opening gaps around the torsion hinges and to form a thin layer with a predetermined thickness on top of hinges 851. A preferred thickness is slightly larger than $G=0.5\times W\times SIN(\theta)$, where W is the cross section width of hinge support posts 105. The sacrificial layer is patterned to form a plurality of spacers on top of each torsion hinge 852. A second layer of electromechanical material is deposited to cover the surface of the partially fabricated wafer 853. The second layer of electromechanical material includes a different material from the first layer, formed in step 842. The second electromechanical layer is planarized to a predetermined thickness by CMP 854 before patterning a plurality of openings to form a plurality of gaps between individual mirror plates 870. The reflectivity of the mirror surface is enhanced by a PVD deposition of about 400 angstroms or less of a reflective layer selected from the group consisting of aluminum, gold, and combinations thereof 860. The deposition of the third layer of metal thin-films on the surfaces forms a sandwich structure of the mirror plate that balances out the stresses of each thin-film material to prevent warping of the mirror reflective surfaces.

To separate the fabricated wafer into individual spatial light modulation device dies, a thick layer of sacrificial materials is deposited to cover the fabricated wafer surfaces for protection 880. Then the fabricated wafer is partially sawed 881 before being separating into individual dies by scribing and breaking 882. An SLM device die is attached to the chip base with wire bonds and interconnects 883 before RF or microwave plasma striping of the remaining sacrificial materials 884. The SLM device die is lubricated by exposure to a PECVD coating of lubricants in the interfaces between the mirror plate and the surface of electrodes and landing tips 885. The SLM device is then tested for electro-optical functionally 886. Finally, the SLM device is hermetically sealed with a glass window lip 887 and sent to a burn-in process to increase for reliability and robust quality control 888.

One of the major problems in the digital operation of micro-mirror array is the high stiction of a micro-mirror at a mechanical landing position. The surface contact adhesion can be greater than the electrostatic force of the control circuitry, causing device failure from stiction in a moist environment. To reduce the contact adhesion between the mirror plate 102 and vertical landing tips 222a and 222b, and protect the mechanical wear degradation of interfaces during the touch down and therefore impact of rotation, a thin lubricated coating is deposited on the lower portion of mirror plate 102 and on the upper surface of step electrodes 221a and 221b and vertical landing tips 222a and 222b. The lubricants chosen should be thermally stable, have low vapor pressure, and be non-reactive with metallization and electromechanical materials that form the micro-mirror array devices.

In one embodiment, a fluorocarbon thin film is coated on the surfaces of the lower portion of mirror plate and on the surface of the electrodes and landing tips. The SLM device die is exposed to plasma of fluorocarbons, such as $CF_4$, at a substrate temperature of about 200° C. for less than five minutes. The fluorine coating serves to prevent or reduce adherence or attachment of water to the interfaces of the mirror plate and the electrodes and landing tips, which eliminates the impact of humidity in the stiction of a mirror during landing operation. Coating fluorocarbon film on the interfaces between the mirror plate 102 and step electrodes 221a and 221b and vertical landing tips 222a and 222b provides a sufficient repellent to water due to the fluorine atoms existing near the exposed surfaces.

In one embodiment, a perfluoropolyether (PFPE) or a mixture of PFPE or a phosphazine derivative is deposited by PECVD on the interfaces between the mirror plate 102 and step electrodes 221a and 221b and vertical landing tips 222a and 222b at a substrate temperature of about 200° C. for less than five minutes. PFPE molecules have an aggregate vapor pressure in the range of $1\times10^{-6}$ to $1\times10^{-11}$ atm. The thickness of the lubricant film is less than 1000 angstroms. To improve the adhesion and lubricating performance on the surface of a metallization or an electromechanical layer, phosphate esters may be chosen because of their affinity with the metallic surface.

Figure 14:
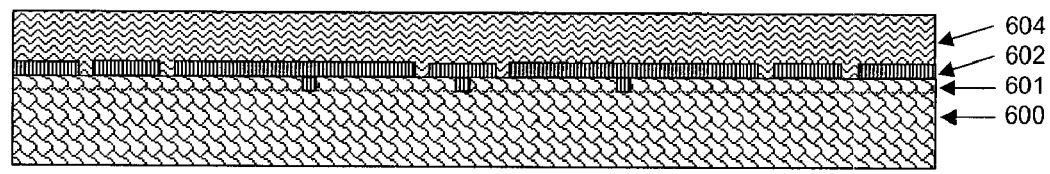
FIGS. 14-17 are cross-sectional side views of a part of a spatial light modulator; the figures illustrate one method for fabricating support posts, second level electrodes, and landing tips on the surface of a control substrate.
Figure 17:
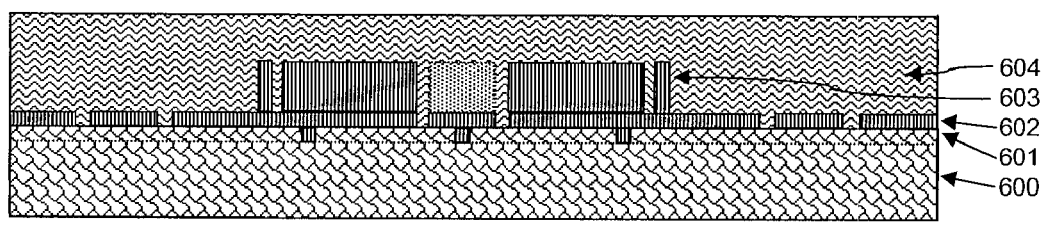
Figure 18:
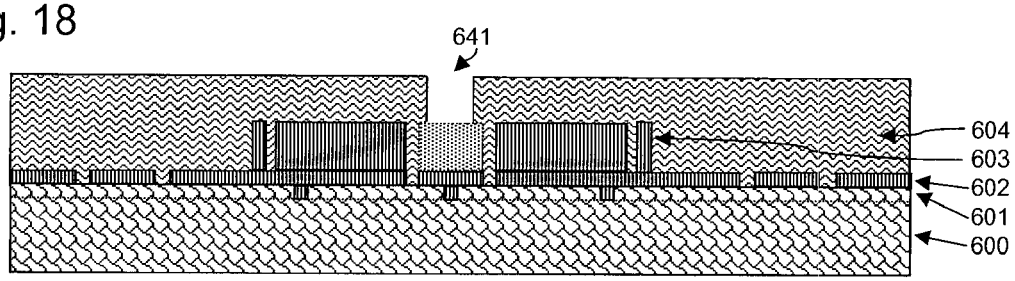
FIGS. 18-20 are cross-sectional side views of a part of a spatial light modulator; the figures illustrate one method for fabricating a plurality of torsion hinges and supports on the support frame.
Figure 19:
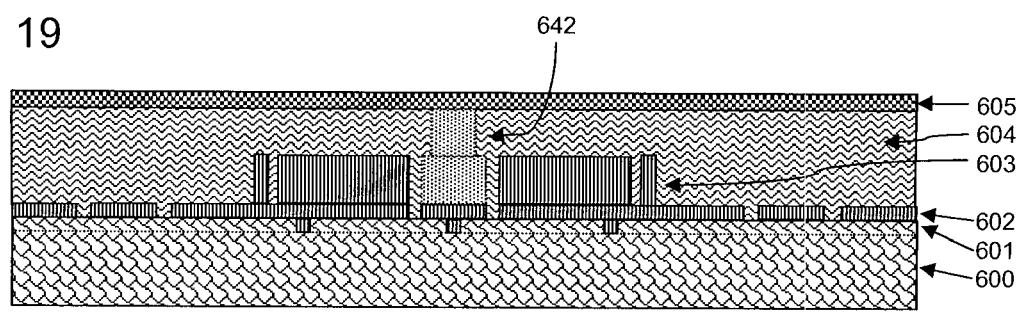
Figure 20:
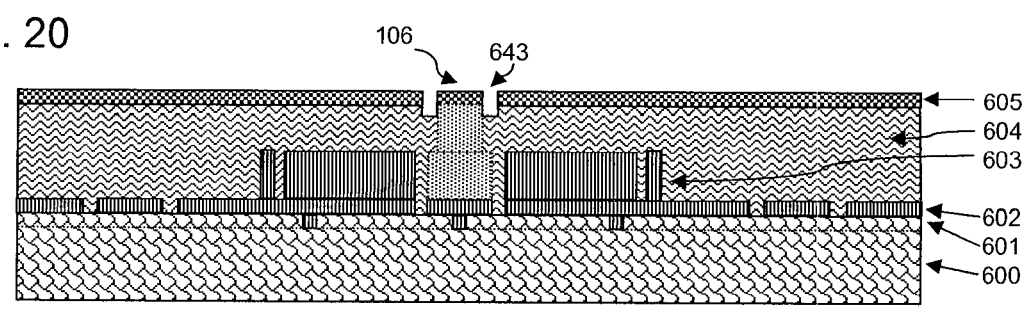
Figure 21:
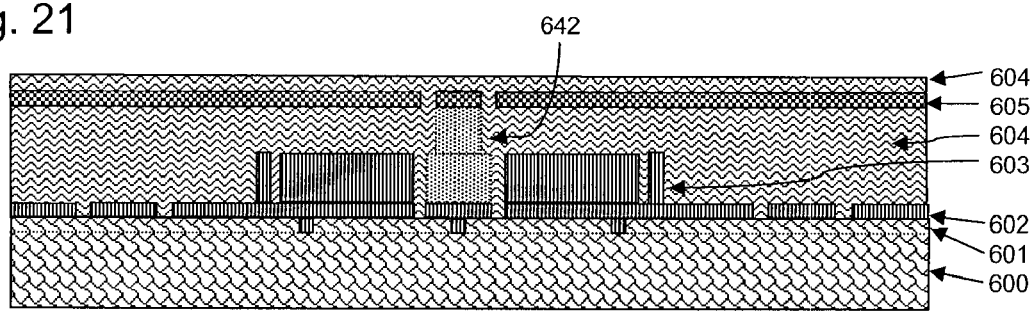
FIGS. 21-23 are cross-sectional side views of a part of a spatial light modulator; the figures illustrate one method for fabricating a mirror plate with embedded hidden hinges.
Figure 22:
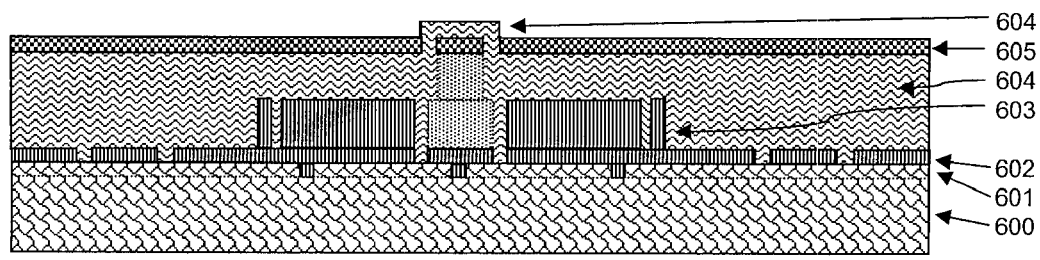
Figure 23:
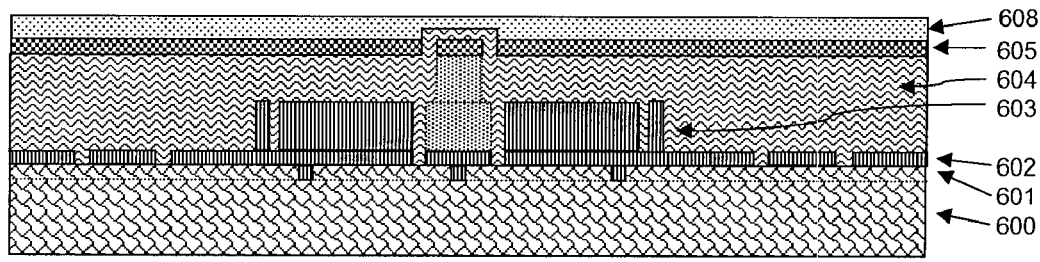

A more detailed description of an exemplary process of fabricating a high contrast SLM device is illustrated in a series of cross-sectional diagrams. FIG. 10 to FIG. 13 are cross-sectional side views of a part of an SLM illustrating one method for fabricating a plurality of support frames and the first level electrodes connected to the memory cells in the addressing circuitry. FIGS. 14 and 17 are cross sectional side views of a part of an SLM illustrating one method for fabricating a plurality of support posts, second level electrodes, and landing tips on the surface of control substrate. FIGS. 18 to 20 are cross-sectional side views of a part of an SLM illustrating one method for fabricating a plurality of torsion hinges and supports on the support frame. FIGS. 21 to 23 are cross-sectional side views of a part of an SLM illustrating one method for fabricating a mirror plate with a plurality of embedded hidden hinges. FIGS. 23 to 26 are cross-sectional side views of a part of an SLM illustrating one method for forming the reflective mirrors and releasing individual mirrors of a micro-mirror array.

Figure 10:
FIGS. 10-13 are cross-sectional side views of a part of a spatial light modulator; the figures illustrate one method for fabricating support frames and first level electrodes connected to memory cells in addressing circuitry.
Figure 11:
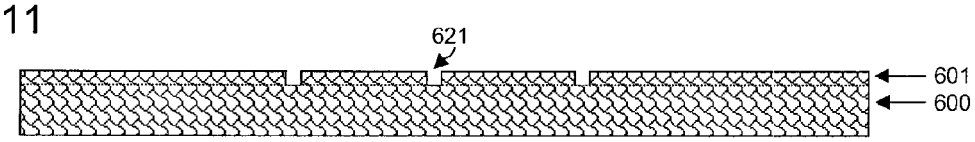

FIG. 10 is a cross-sectional view that illustrates the control silicon wafer substrate 600 after using standard CMOS fabrication technology. In one embodiment, the control circuitry in the control substrate includes an array of memory cells, and word-line/bit-line interconnects for communication signals. There are many different methods to make electrical circuitry that performs the addressing function. DRAM, SRAM, and latch devices commonly known all perform an addressing function. Since the mirror plate 102 area may be relatively large on semiconductor scales (for example, the mirror plate 102 may have an area of larger than 100 square microns), complex circuitry can be manufactured beneath mirror plate 102. Possible circuitry includes, but is not limited to, storage buffers to store time sequential pixel information, and circuitry to perform pulse width modulation conversions.

In a typical CMOS fabrication process, the control silicon wafer substrate is covered with a passivation layer 601, such as silicon oxide or silicon nitride. The passivated control substrate 600 is patterned and etched anisotropically to form via 621 connected to the word-line/bit-line interconnects in the addressing circuitry, shown in FIG. 11. According to another embodiment of the present invention, anisotropic etching of dielectric materials, such as silicon oxides or silicon nitrides, is accomplished with $C_2F_6$ and $CHF_3$ based feedstock and their mixtures with He and $O_2$. One preferred high selectivity dielectric etching process flows $C_2F_6$, $CHF_3$, He, and $O_2$ at a ratio of 10:10:5:2 mixtures at a total pressure of 100 mTorr with an inductive source power of 1200 watts and a bias power 600 watts. The wafers are then cooled with a backside helium gas flow of 20 sccm at a pressure of 2 torr. A typical silicon oxide etch rate can reach 8000 angstroms per minute.

Figure 12:
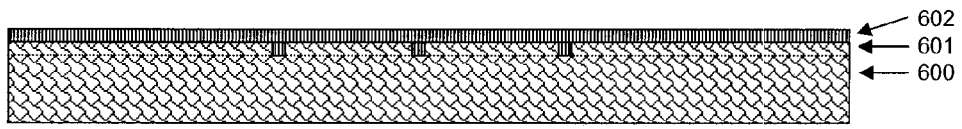
Figure 13:
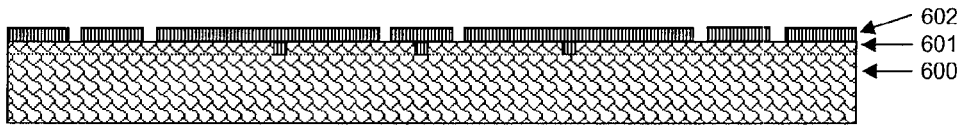

Next, FIG. 12 shows that an electromechanical layer 602 is deposited by PVD or PECVD depending on the electromechanical materials selected. This electromechanical layer 602 is patterned to define hinge support frames 202 and the first and second levels of step electrodes 221a and 221b corresponding to each mirror plate 102, shown in FIG. 12. The patterning of the electromechanical layer 602 can be performed by the following processes. First, a layer of photoresist is spin coated to cover the substrate surface. Then photoresist layer is exposed to standard photolithography and is developed to form predetermined patterns. The electromechanical layer is etched anisotropically through to form a plurality of vias and openings. Once the vias and openings are formed, residues are removed from the surfaces and inside the openings, which cleans the partially fabricated wafer. This is accomplished by exposing the patterned wafer to 2000 watts of RF or microwave plasma with 2 torr total pressure of a mixture of $O_2$, $CF_4$, and $H_2O$ gases at a ratio of 40:1:5 at about 250° C. for less than five minutes. Finally, the surfaces of the electromechanical layer are passivated by exposure to 2000 watts of RF or microwave plasma with 2 torr pressures of a 3000 sccm of $H_2O$ vapor at about 250° C. temperatures for less than three minutes.

The next step is forming a plurality of second level electrodes 221, micro landing tips 222, and support posts 105 on the surface of the partially fabricated wafer. A micron thick sacrificial material 604 is deposited on the substrate surface, which can be spin coated photoresist or PECVD of organic polymers, as shown in FIG. 14. The sacrificial layer 604 is hardened by a series thermal and plasma treatments to transform the structure of the sacrificial materials from a hydrophobic state to hydrophilic state of polymers. First, the sacrificial layer 604 is exposed to ultraviolet light, then to a $CF_4$ plasma for about three minutes, followed by baking the sacrificial layer at about 150° C. for about two hours before exposing the sacrificial layer to oxygen plasma for about one minute. In some cases, implanting the sacrificial layer with KeV energy of silicon, boron, or phosphorous ions further hardens the sacrificial layers 604.

Figure 15:
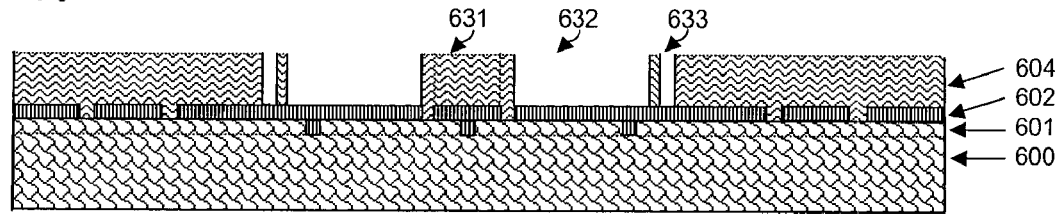
Figure 16:
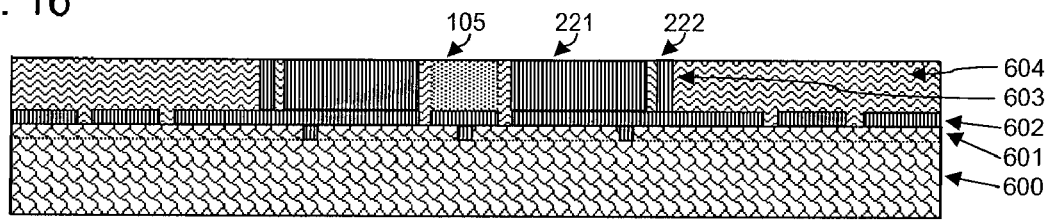

Then, sacrificial layer 604 is patterned to form a plurality of via and contact openings for second level electrodes 632, micro landing tips 633, and support posts 631 as shown in FIG. 15. To enhance the adhesion for a subsequent electromechanical layer, the via and contact openings are exposed to 2000 watts of RF or microwave plasma with 2 torr total pressures of a mixture of $O_2$, $CF_4$, and $H_2O$ gases at a ratio of 40:1:5 at about 250° C. for less than five minutes. Electromechanical material 603 is then deposited to fill via and contact openings. The filling is done by either PECVD or PVD depending on the materials selected. For the materials selected from the group consisting of aluminum, titanium, tungsten, molybdenum, their alloys, PVD is a common deposition method in the semiconductor industry. For the materials selected from the group consisting of silicon, amorphous silicon, polysilicon, silicide, polycide, tungsten, and their combinations, PECVD is chosen as a method of deposition. The partially fabricated wafer is further planarized by CMP to a predetermined thickness slightly less than one micron, as shown in FIG. 16.

After the CMP planarization, FIG. 17 shows that another layer of sacrificial materials 604 is spin coated on the blanket surface to a predetermined thickness and hardened to form the gap under the torsion hinges. The sacrificial layer 604 is patterned to form a plurality of via or contact openings for hinge support posts 641, as shown in FIG. 18. In FIG. 19, electromechanical material is deposited to fill the vias and form a first electromechanical layer 605, which is a torsion hinge layer, on the surface. This hinge layer is then planarized by CMP to a predetermined thickness. The thickness of the first electromechanical layer 605 formed here defines the thickness of torsion hinge bar and the mechanical performance of the mirror.

The partially fabricated wafer is patterned and etched anisotropically to form a plurality of torsion hinges 106 in the first electromechanical layer 605, as shown in FIG. 20. More sacrificial materials 604 are deposited to fill the openings 643 surrounding each hinge and to form a thin layer 604 with predetermined thickness on the surface, as shown in FIG. 21. The thickness of this layer 604 defines the height of the spacers on top of each torsion hinge 106. The sacrificial layer 604 is then patterned to form a plurality of spacers on top of each torsion hinge 106, as shown in FIG. 22. Since the top surfaces of support posts 642 are also under the cavities as lower parts of the mirror plate 102, the gap G in the cavity needs to be high enough to accommodate the angular rotation of mirror plate 102 without touching the larger hinge support posts 105 at a pre-determined angle θ. In order for the mirror to rotate a pre-determined angle θ without touching the hinge support post 105, the gap of the cavities where the torsion hinges 106 are embedded must be larger than $G=0.5 \times W \times SIN(\theta)$, where W is the cross sectional width of the hinge support posts 105. Each mirror in the array may rotate 15° in each direction. The calculation indicates the air gap spacing G of torsion hinge 106 in the cavity must be larger than G=0.13W. If width of each side W of a square shape hinge support post 105 is 1.0 micron, the gap G in the cavity should be larger than 0.13 microns.

Figure 24:
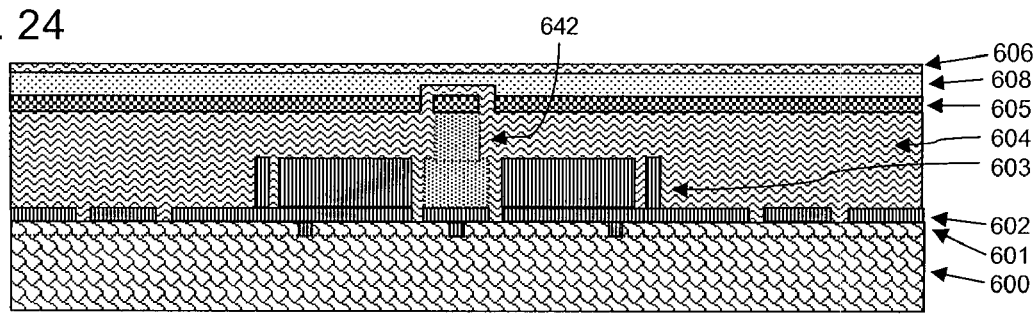
Figure 25:
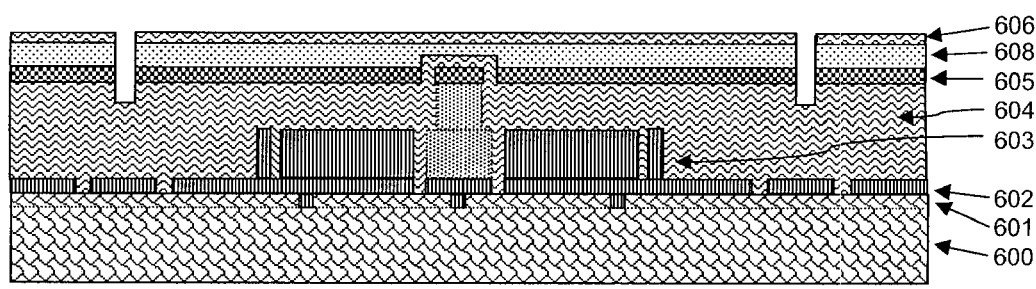

To form a mirror with embedded torsion hinges 106 under each cavity in the lower portion of mirror plate 102, a second layer of electromechanical material 608 is deposited to cover the first electromechanical material layer 605 and a plurality of sacrificial spacers, as shown in FIG. 23. The second layer of electromechanical material 608 is a different material than the material used to form the first electromechanical material layer 605. In some cases, CMP is used to ensure a flat reflective surface of the electromechanical layer 608 has been achieved before etching to form individual mirrors. As an alternative to CMP, reactive ion etch can also be used to planarize the electromechanical layer 608. The thickness of the first electromechanical layer 605 and the second electromechanical layer 608 is the approximate thickness, or a little less than the thickness, of the mirror plate 102 eventually fabricated. In FIG. 23, the surface of a partially fabricated wafer is planarized by CMP to a predetermined thickness of mirror plate 102. The thickness of the mirror plate 605 can be between about 0.3 microns to 0.5 microns. If the electromechanical material is aluminum or its metallic alloy, the reflectivity of the mirror is high enough for most display applications. For some other electromechanical materials or for other applications, the reflectivity of the mirror surface may be enhanced by deposition of a reflective layer 606 of about 400 angstroms or less of a reflective material selected from the group consisting of aluminum, gold, their alloys, and combinations, as shown in FIG. 24. The reflective surface 606 of the electromechanical layer is then patterned and etched anisotropically through to form a plurality of individual mirrors, as shown in FIG. 25.

Figure 26:
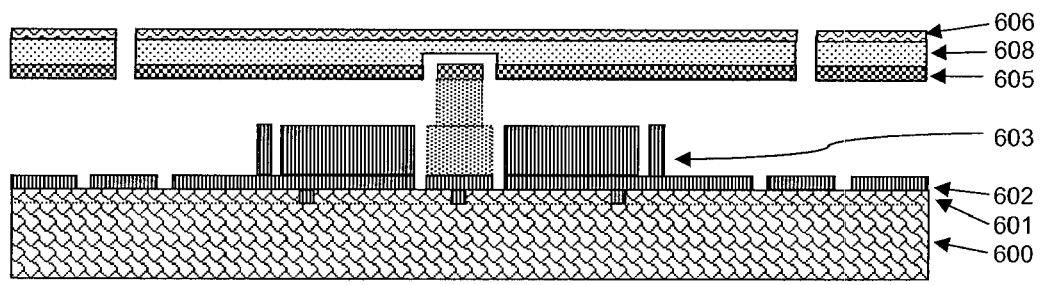

FIG. 26 shows the structure after the remaining sacrificial materials 604 are removed and residues are cleaned through a plurality of gaps between individual mirrors in the array to form a functional micro-mirror array based SLM device. In a real manufacturing environment, more processes may be required before delivering a functional SLM device for a video display application. After the reflective surface 606 of the electromechanical layer 605 is patterned and etched anisotropically through to form a plurality of individual mirrors, more sacrificial materials 604 are deposited to cover the surface of the fabricated wafer. With its surface protected by a layer of sacrificial layer 604, the fabricated wafer goes through common semiconductor packaging processes to form individual device dies. In a packaging process, the fabricated wafer is partially sawed 881 before separated into individual dies by scribing and breaking 882. The SLM device die is attached to the chip base with wire bonds and interconnects 883 before striping the remaining sacrificial materials 604 and its residues in the structures 884. In one embodiment, cleaning is accomplished by exposing the patterned wafer to a 2000 watts of RF or microwave plasma with 2 torr total pressures of a mixture of $O_2$, $CF_4$, and $H_2O$ gases at a ratio of 40:1:5 at about 250° C. for less than five minutes. Finally, the surfaces of electromechanical and metallization structures are passivated by exposing them to a 2000 watts of RF or microwave plasma with 2 torr pressures of a 3000 sccm of $H_2O$ vapor at about 250° C. for less than three minutes.

The SLM device die is further coated with an anti-stiction layer inside the opening structures by exposure to a PECVD of fluorocarbon at about 200° C. for less than five minutes 885 before plasma cleaning and electro-optical functional test 886. Finally, the SLM device is hermetically sealed with a glass window lip 887 and sent to burn-in process for reliability and robust quality control 888.

As noted herein, the three layer mirror structure described in some of the embodiments can prevent warping of the mirror plate when the mirror plate temperature rises, such as during operation of the SLM. The conductive and reflective layers of the mirror plate can have different stress and thermal coefficients. The disparity in these properties of the mirrors can cause the mirror to bend or warp. Bending or warping of the mirror plate can decrease the contrast ratio of the device. Light that is meant to be reflected away from a projection pupil can be reflected toward the pupil by warped parts of the mirror. Similarly, light that is to be directed toward the pupil can be bent away from the pupil, further reducing the contrast of the device.

By including a spacer layer between the conductive lower portion of the mirror and the reflective upper portion, warping and deformation of the mirror plate can be reduced or eliminated. The spacer layer is formed of a material that is different from both the conductive lower portion and the reflective upper portion. The material for the spacer layer is selected based on its thin film mechanical stress and thermal expansion coefficient. The spacer layer prevents mirror plate bending after the fabrication processes or when the mirror temperature changes. An alternative to using a three layer structure is to make one of the layers, such as the lower conductive layer, thicker. A thicker film is less likely to warp or deform than a thin film. However, as the mirror becomes thicker, the mirror becomes heavier. A heavier mirror has a lower resonance frequency and cannot be rotated as quickly. Additionally, miniaturization of mirrors is desirable to enhance yield, provide devices with a small footprint and reduce cost. As the mirrors are miniaturized, the proportionality of the thickness to the length and width dimensions is also maintained. Thus, a thick mirror is not always an available solution to overcoming mirror warping. As the mirrors are made thinner, the likelihood of warping can increase. Therefore, the think film three layer structure can provide an advantage in a high density and high speed SLM device.

Although the invention has been particularly shown and described with reference to multiple embodiments, it will be understood by persons skilled in the relevant art that various changes in form and details can be made therein without departing from the spirit and scope of the invention. For example, the same 3-dimensional multi-layer structures may be constructed by patterning and etching the electromechanical layers, rather than patterning the sacrificial layers and etching vias. As an alternative to mirrors having a 10 by 10 micron dimension, the mirrors can have a smaller dimension, such as 9 by 9 microns, 8 by 8 microns, 7 by 7 microns 6 by 6 microns, 5 by 5 microns, or even smaller.

Aside from video displays and printing, the SLMs described here are also useful in other applications, such as in maskless photolithography, where the SLM directs light to develop deposited photoresist, and in photonic switches, where the optical signals are directed and distributed among fiber optical networks.

What is claimed is:

1. A spatial light modulator device comprising:
    a control substrate having an upper portion with a plurality of electrodes connected to functional circuitry;
    a support post on the control substrate; and
    a mirror plate supported by the support post, the mirror plate having an upper reflective surface, a spacer layer and a lower conductive portion, wherein each of the upper reflective surface, spacer layer and lower conductive portion have a different material composition from one another.

2. The device of claim 1, wherein:
    the lower conductive portion includes a hinge;
    a pair of support posts support the hinge; and
    the mirror plate is rotatable about the hinge.

3. The device of claim 2, wherein the support posts include amorphous silicon.

4. The device of claim 1, wherein:
    the spacer layer includes amorphous silicon; and
    the lower conductive portion includes a metal.

5. The device of claim 4, wherein the lower conductive portion includes titanium.

6. The device of claim 4, wherein the lower conductive portion includes a titanium alloy.

7. The device of claim 4, wherein the upper reflective surface includes aluminum.

8. The device of claim 4, wherein the upper reflective layer has a thickness of approximately 400 angstroms or less and is selected from the group of metals consisting of aluminum, gold, and combinations thereof.

9. The device of claim 4, wherein the lower conductive portion is one of tantalum, tungsten, molybdenum, nickel or their alloys.

10. The device of claim 4, wherein the lower conductive portion is a silicide of titanium, tantalum, tungsten, molybdenum or nickel.

11. The device of claim 1, wherein:
    the upper reflective layer includes aluminum;
    the spacer layer includes amorphous silicon; and
    the lower conductive portion includes titanium.

12. The device of claim 1, wherein the lower conductive portion is titanium, tantalum, tungsten, molybdenum, nickel or an alloy thereof.

13. The device of claim 1, wherein the spacer layer includes a low temperature deposited material.

14. The device of claim 1, wherein the mirror plate has a thickness of between about 3000 and 5000 angstroms.

15. The device of claim 1, wherein the mirror plate has a thickness of between about 1000 and 3000 angstroms.

16. The device of claim 1, wherein the spacer layer is between about 1000 and 2000 angstroms thick.

17. The device of claim 1, wherein the spacer layer is between about 2000 and 5000 angstroms thick.

18. The device of claim 1, further comprising a lubricating layer on the lower conductive portion.

19. A method of forming a spatial light modulator device, comprising:
   forming a plurality of electrodes on an upper portion of a control substrate, wherein the electrodes are connected to functional circuitry;
   forming a support post on the control substrate; and
   forming a mirror plate supported by the support post, wherein forming the mirror plate includes forming an upper reflective surface, a spacer layer and a lower conductive portion, wherein each of the upper reflective surface, spacer layer and lower conductive portion have a different material composition from one another.

20. A method of using a spatial light modulator device, comprising applying a voltage to at least one electrode of the plurality of electrodes of the spatial light modulator of claim 1, wherein the voltage causes the mirror plate to rotate towards the electrode.

* * * * *